(12) United States Patent
Fu et al.

(10) Patent No.: US 7,139,348 B1
(45) Date of Patent: Nov. 21, 2006

(54) DISTRIBUTED CLOCK NETWORK USING ALL-DIGITAL MASTER-SLAVE DELAY LOCK LOOPS

(75) Inventors: Wei Fu, San Diego, CA (US); Joseph J. Balardeta, Del Mar, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 879 days.

(21) Appl. No.: 10/120,598

(22) Filed: Apr. 9, 2002

(51) Int. Cl.
 *H03D 3/24* (2006.01)
 *H03L 7/06* (2006.01)
 *G06F 1/12* (2006.01)

(52) U.S. Cl. .................. 375/376; 327/149; 713/401
(58) Field of Classification Search .......... 375/376, 375/355, 149, 226, 294, 327, 371, 373, 375; 326/30; 327/158, 156, 147, 149, 153, 161, 327/202.3, 237, 244; 703/19; 710/305; 714/400; 716/1, 6; 713/400
See application file for complete search history.

(56) References Cited

U.S. PATENT DOCUMENTS

| | | | | |
|---|---|---|---|---|
| 5,822,255 | A * | 10/1998 | Uchida | 365/194 |
| 6,173,432 | B1 * | 1/2001 | Harrison | 716/1 |
| 6,445,231 | B1 * | 9/2002 | Baker et al. | 327/158 |
| 6,570,944 | B1 * | 5/2003 | Best et al. | 375/355 |
| 6,687,780 | B1 * | 2/2004 | Garlepp et al. | 710/305 |
| 6,832,325 | B1 * | 12/2004 | Liu | 713/400 |
| 6,839,860 | B1 * | 1/2005 | Lin | 713/401 |
| 2002/0116656 | A1 * | 8/2002 | Lee et al. | 713/500 |
| 2003/0016063 | A1 * | 1/2003 | Park et al. | 327/158 |
| 2003/0071669 | A1 * | 4/2003 | Liu et al. | 327/158 |
| 2003/0154416 | A1 * | 8/2003 | LaBerge | 713/400 |

OTHER PUBLICATIONS

Lee, Thomas H., et al, "A 2.5 CMOS Delay-Locked Loop for an 18 Mbit, 500 Megabyte/s DRAM," IEEE Journal of Solid-State Circuits, vol. 29, No. 12, Dec. 1994, pp. 1491-1496.

\* cited by examiner

*Primary Examiner*—Mohammed Ghayour
*Assistant Examiner*—Aslan Ettehadieh
(74) *Attorney, Agent, or Firm*—INCAPLAW; Terrance A. Meador

(57) ABSTRACT

A distributed clock circuit for clocking high speed data at various different physical locations on a chip while improving setup and hold times. The clock circuit includes a master delay lock loop (DLL) circuit configured to lock a global clock signal with a first data signal, and output a clock delay control signal when the global clock signal is locked. The clock circuit further includes one or more slave DLL circuits, coupled to receive the clock delay control signal to lock a local clock signal with a local data signal, wherein the local clock signal is based on the global clock signal.

13 Claims, 4 Drawing Sheets

DISTRIBUTED CLOCK NETWORK USING ALL-DIGITAL MASTER-SLAVE DELAY LOCK LOOPS

BACKGROUND OF THE INVENTION

The present invention generally relates to digital communications, and more particularly to a delay lock loop (DLL) circuit for improving setup and hold times for a parallel data communication system.

Digital communications promises faster, flexible, and more reliable speeds than conventional analog communications. Accordingly, various time measurements become critical. For instance, in a digital communication system, setup time represents the length of time that a pulse is held in order to produce a state change. Hold time represents the length of time a signal is maintained at a certain input after changing state at another input. Low setup and hold times are important, especially for high speed parallel data.

The setup and hold time windows on high speed data lines can be degraded by clock driver and data driver skew, duty cycle distortion of data drivers, clock and data jitter, and power supply noise. High speed data from different physical locations on a chip suffers not only from poor setup and hold times, but also clock skew in passing clock information to the various different physical locations. Some clock distribution schemes exist for providing synchronized clock signals to different locations, however there is a need for a clock distribution network that also improves setup and hold times for physically separated parallel data.

DETAILED DESCRIPTION OF THE PREFERRED EMBODIMENTS

This invention provides a clock distribution network using an all-digital delay lock loop architecture. In one example, the clock distribution network is implemented on a chip to distribute clock information to various physical locations on the chip. In an exemplary embodiment, a distributed clock circuit for distributed high speed data includes a master delay lock loop (DLL) circuits and one or more slave DLL circuits. The slave DLL circuits are distributed physically around to various locations on the chip. The master DLL circuit is configured to lock a global clock signal with a first data signal, and output a clock delay control signal when the global clock signal is locked. The one or more slave DLL circuits are coupled to receive the clock delay control signal to lock a local clock signal with a local data signal. In the preferred embodiment, the local clock signal is based on the global clock signal.

In the example, the master DLL circuit includes a master clock DLL and at least one data DLL. The master clock DLL is configured to adjust a delay of the global clock signal until a clock signal pulse is locked within an eye opening of the first data signal, and when the clock signal pulse is locked, configured to output the clock delay control signal. Each data DLL is configured to adjust a delay of the first data signal to substantially center the eye opening of the first data signal on the global clock signal pulse.

Further in accordance with the invention, each slave DLL circuit is configured to use the clock delay control signal to adjust a delay of a local clock signal to lock a local clock signal pulse within an eye opening of the local data signal. The slave DLL circuit includes at least one data DLL configured to delay the local data signal to substantially center the eye opening of the local data signal on the local clock signal pulse. The number of data DLLs for each slave DLL circuit preferably corresponds to the number of bits in the local data signal.

In accordance with another example of the invention, a method of distributing a clock signal to different locations on a chip includes adjusting a delay of a global clock signal until a global clock signal pulse is locked within an eye opening of at least one data signal. The method further includes generating a clock delay control signal based on the adjusted delay for distribution to at least one local clock signal, based on the global clock signal, at the different locations on the chip.

According to yet another example of the invention, the method further includes the steps of receiving the clock delay control signal at one or more of the different locations on the chip having a local clock signal, and adjusting a delay of the local clock signal according to the clock delay control signal to lock a local clock signal pulse within an eye opening of at least one data signal at the one or more locations.

Figure 1:
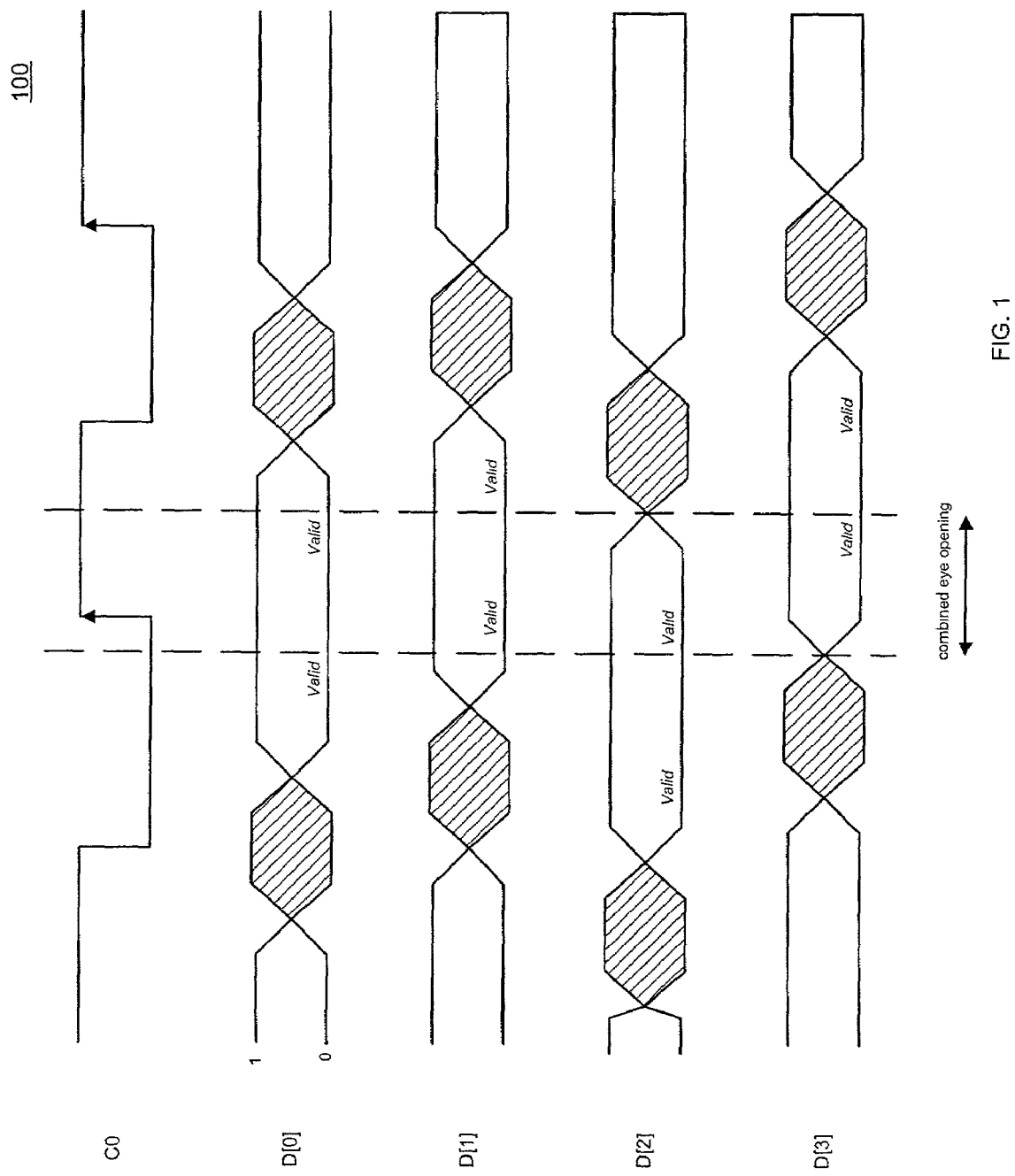
FIG. 1 depicts a graph showing combined high-speed parallel data signals and a clock signal.

FIG. 1 depicts a graph 100 showing a clock signal C0 and parallel data signals D[0], D[1], D[2], and D[3]. A first data signal, i.e. D[0], may be received by the master DLL circuit. The other data signals, i.e. D[1], D[2], and D[3], are preferably received by respective slave DLL circuits.

Each data signal includes an eye opening which carries data, and which is separated by transitions from a null portion, represented as a shaded, smaller eye opening. The change from a null portion to an eye opening, and vice versa, represents a state change. The parallel data signals may be partially-coincident, meaning that they are partially time shifted from each other due to noise, transmission line loss, etc. The clock signal C0 includes periodic pulses, i.e. a clock signal rising edge or falling edge. Preferably the clock signal rising edge is used as the clock signal pulse.

The data signals may exist at different locations on a chip, without the benefit of a common local clock signal source. This invention provides a circuit and method for distributing clock signals that are synchronized, and which improve the output setup and hold time of different sources of parallel data.

Figure 2:
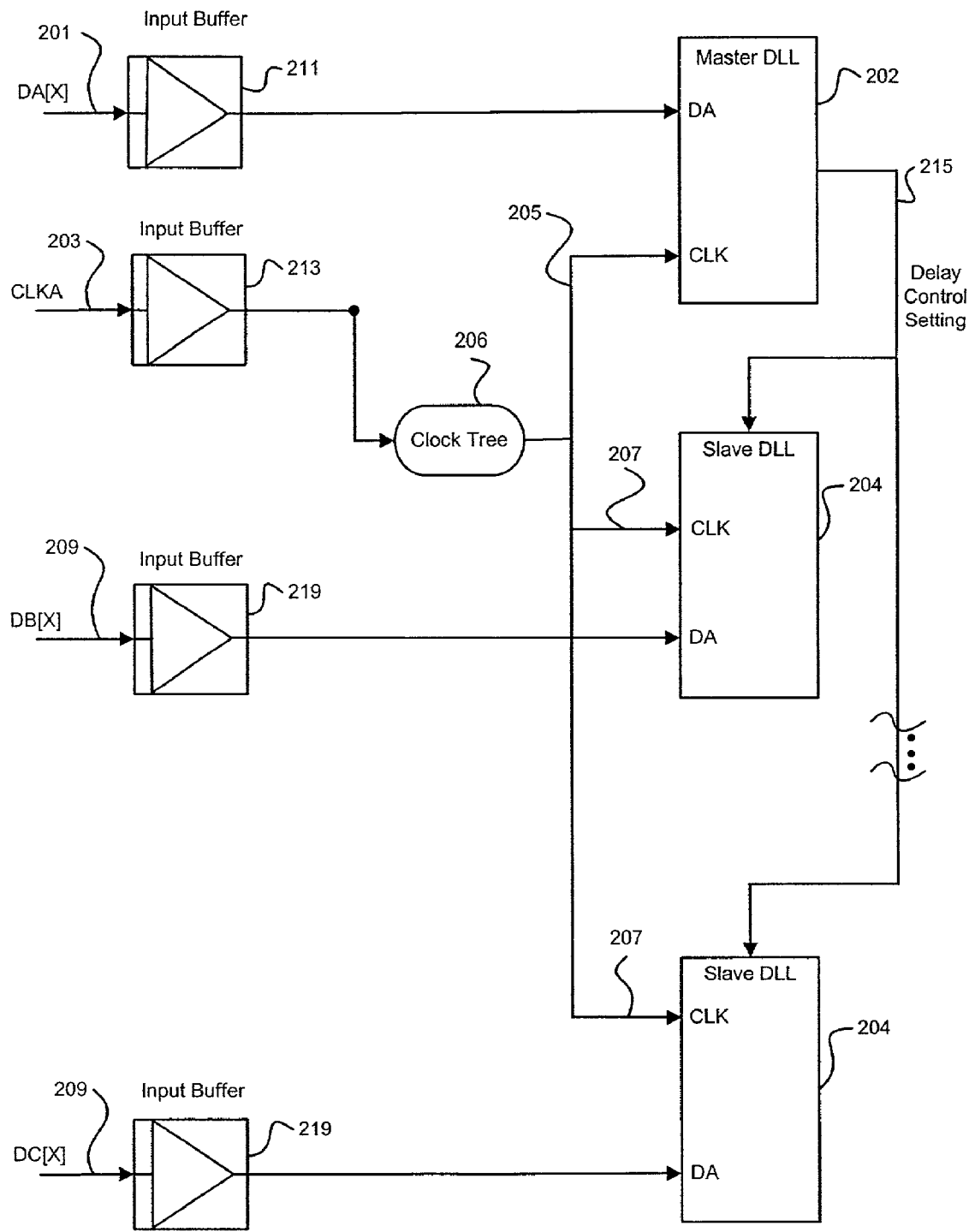
FIG. 2 is a simplified circuit diagram of a clock distribution network accordance with an embodiment of the invention.

FIG. 2 is a chip-level block diagram of a clock distribution network 200 according to one embodiment of the invention. The clock distribution network 200 includes a master DLL circuit 202 and one or more slave DLL circuits 204. For simplicity and ease of explanation, only two slave DLL circuits 204 are illustrated in FIG. 2, however those having skill in the art would recognize that three or more slave DLL circuits 204 may suitably be used in a clock distribution network without departing from the intent and scope of the invention. Preferably, a slave DLL circuit 204 is located at any location on a chip where digital data transmission requires a clock.

The master DLL circuit 202 receives a first data signal on a first data signal input 201 and a global clock signal from a global clock signal input 203. The first data signal can be a single signal, or a plurality of parallel data signals. The global clock signal is provided on clock signal input 205, which is connected to the global clock signal input 203 via clock tree circuit 206 and input clock buffer 213. Accordingly, the clock signal received by the master DLL circuit 202 represents the global clock signal, but can also be considered a local clock signal provided specifically to the master DLL circuit 202 where it is located on the chip. The first data signal input 201 is coupled to an input data buffer 211, which is in turn connected to a data input DA of the master DLL circuit 202.

The master DLL circuit 202 is configured to lock the global clock signal with the first data signal, and output a clock delay control signal on a clock delay control signal output 215 when the global clock signal is locked. The clock delay control signal output 215 is connected to each slave DLL circuit 204 to supply the clock delay control signal. The clock delay control signal output 215 can be implemented as a low-speed bus connected to each of the slave DLLs on a chip.

The slave DLL circuits 204 receive a local data signal on a local data signal input 209 and a local clock signal on a local clock signal input 207. The local clock signal is preferably provided by the clock tree circuit 206. The local data signal can be a single signal, or a plurality of parallel data signals. The local data signal is received on a local data signal input DA via an input data buffer 219.

Figure 3:
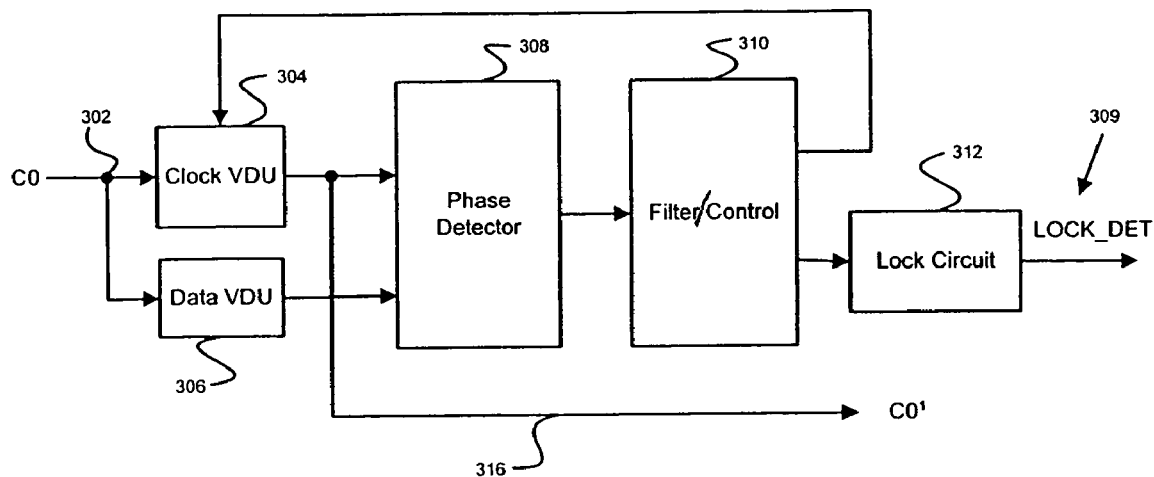
FIG. 3 is a simplified circuit diagram of a master delay lock loop circuit in accordance with an embodiment of the invention.
Figure 3:
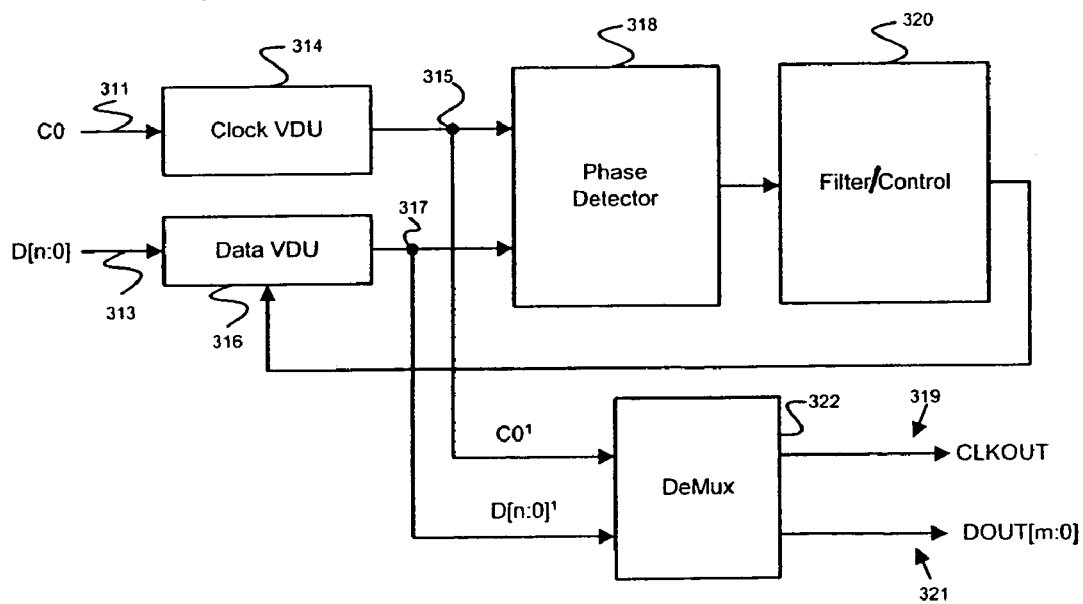
Figure 4:
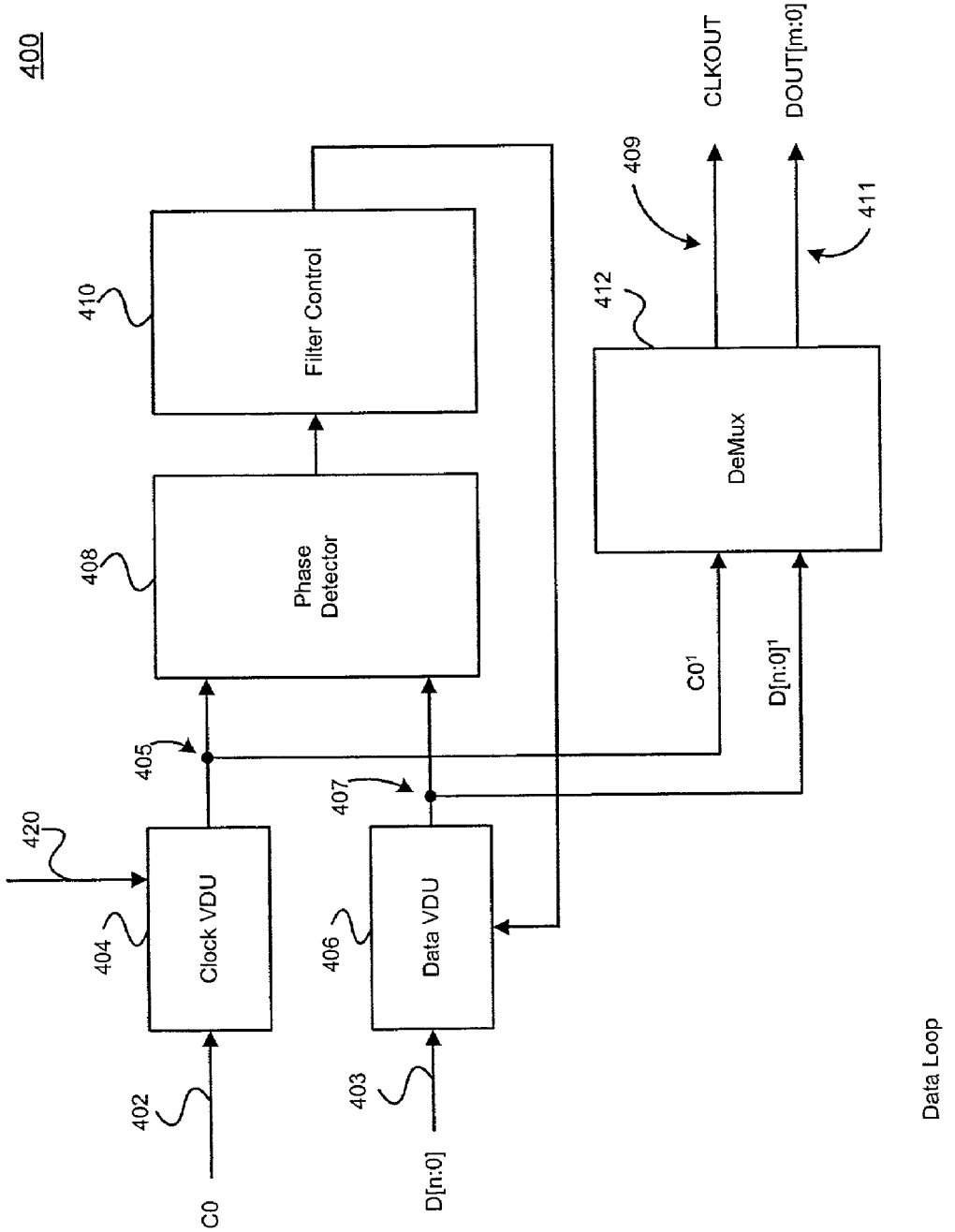
FIG. 4 is a simplified circuit diagram of a slave delay lock loop circuit according to a preferred embodiment of the invention.

FIGS. 3 and 4 illustrate specific exemplary embodiments and operation of the master DLL circuit 202 and slave DLL circuits 204. FIG. 3 is a simplified block diagram of a master DLL circuit 300 according to a preferred embodiment of the invention. The master DLL circuit 300 includes a clock DLL 301 and one or more data DLLs 303. More than one data DLL 303 can be used where parallel data signals are present. The master DLL circuit 300 calibrates a clock signal to alignment with a local master data signal, then sends calibration information to each one of the slave DLL circuits 204 for alignment of a global clock signal with local data signals.

The clock DLL 301 includes a clock signal input 302, a clock variable delay unit (VDU) 304, a data VDU 306, a phase detector 308, a filter/control circuit 310, and a lock circuit 312. The clock DLL 301 also includes a lock detection signal output 314 and a delayed clock signal output 316. The clock VDU 304 has a first input coupled to the clock signal input 302, and an output coupled to the delayed clock signal output. The data VDU 306 has an input coupled to the clock signal input 302. The phase detector 308 has a first input coupled to the clock VDU output 316, and a second input coupled to an output of the data VDU 306. The filter/control circuit 310 has an input coupled to an output of the phase detector 308, and a first output connected to a second input of the clock VDU 304. The lock circuit 312 has an input coupled to a second output of the filter/control circuit 310, and an output coupled to a clock delay control signal output 309.

The data loop 303 includes a clock signal input 311 and a data signal input 313. The data loop 303 further includes a clock VDU 314 having an input coupled to the clock signal input 311, and having a delayed clock signal output 315. A data VDU 316 is provided having a first input coupled to the data signal input 313, and a delayed data signal output 317. The data loop 303 further includes a phase detector 318 having a first input coupled to the delayed clock signal output 315, and a second input coupled to the delayed data signal output 317. The data loop 303 also includes a filter/control circuit 320 having an input coupled to an output of the phase detector, and an output connected to a second input of the data VDU 316. The data loop 303 further includes a demultiplexer 322 having a first input coupled to the delayed clock signal output 315 and a second input coupled to the delayed data signal output 317, and having demultiplexed clock and data outputs 319 and 321, respectively.

The clock VDU 301 receives and delays a global clock signal on the clock signal input 302. The data VDU 306 also receives and delays the global clock signal. The phase detector 308 is configured to receive both delayed global clock signals, and measure a phase difference between them. The filter/control circuit 310 filters the output of the phase detector 308 and adjusts a delay of the clock VDU 304 to align a global clock signal pulse within an eye opening of each one of a plurality of at least partially-coincident parallel data signals, as indicated in FIG. 1. The parallel data signals are each received at one of N data DLLs. The lock circuit 312 generates the lock signal on the lock detection signal output 314 when the clock signal is aligned. The lock circuit 312 monitors the filter/control circuit 310 outputs to determine if the two clock signals, i.e. from the clock VDU 304 and the data VDU 306, are phase-aligned. Once aligned, the lock signal goes HIGH, representing the clock delay control signal. Preferably, the lock circuit 312 is equipped with hysteresis to ensure metastability.

The data DLL 303 is activated by the clock delay control signal. The clock VDU 314 of the data DLL 303 receives and delays the global clock signal on clock signal input 311. The data VDU 316 receives and delays at least one first data signal on data signal input 313. The phase detector 318 measures a phase difference between the delayed global clock signal and the delayed first data signal. The filter/control circuit 320 filters the output of the phase detector 318 and adjusts the delay of the data VDU 316 to align the first data signal with the adjusted delayed clock signal. The center of an eye opening of the first data signal can be used for alignment with the clock signal. The demultiplexer 322 outputs the aligned data signal and adjusted delayed clock signal. Each of the N data DLLs 303 will perform the same operation in parallel, resulting in data bits being output to a deserializer with large setup and hold time windows.

In each of the clock DLL 301 and data DLLs 303, a nonlinear digital filter is preferably used in the filter/control circuit 210, 310 to achieve low jitter performance. The nonlinearity of the filter is applied to cancel the nonlinearity of the phase detectors 208 and 308. Thus, the result is low jitter performance when the loops are in lock mode.

FIG. 4 is a simplified block diagram of a slave DLL circuit 400 according to the invention. The slave DLL circuit 400 includes only a data DLL, substantially as described above with respect to data DLL 303 in the master DLL circuit. The slave data DLL circuit 400 includes a local clock signal input 402 and a local data signal input 403. The slave DLL circuit 400 further includes a clock VDU 404 having a first input coupled to the local clock signal input 402, and having a delayed clock signal output 405. The clock VDU 404 further includes a clock delay control input 420 for receiving the clock delay control signal from the master DLL circuit.

The slave DLL circuit further includes a data VDU 406 having a first input coupled to the local data signal input 403, and a delayed local data signal output 407. The data DLL 406 further includes a phase detector 408 having a first input coupled to the delayed clock signal output 405, and a second input coupled to the delayed data signal output 407. The slave DLL circuit 400 also includes a filter/control circuit 420 having an input coupled to an output of the phase detector 408, and an output connected to a second input of the data VDU 406. The slave DLL circuit 400 further includes a demultiplexer 412 having a first input coupled to the delayed clock signal output 405 and a second input coupled to the delayed data signal output 407, and having demultiplexed clock and data outputs 409 and 411, respectively.

The clock delay control signal controls the clock VDU 404 to ensure a local clock signal pulse is aligned within an eye opening of the local data signal, or plurality of parallel local data signals. The slave DLL 400 then operates like the data DLL 303 of the master DLL 300. Thus, a delay of the data VDU 406 is adjusted until the one or more local data signals of that particular slave DLL 400 are aligned to substantially center the eye openings of the data signals on the local clock pulse. Accordingly, the local data signals exhibit improved output setup and hold time, and the local data signals are synchronized with the global clock signal.

While various embodiments of the invention are described above, it should be understood that they are presented for example only, and not as limitations to the following claims. Accordingly, the scope and breadth of the present invention should only be defined in accordance with the following claims and their equivalents.

What is claimed is:

1. A distributed clock circuit for distributed high speed data, comprising:
   a master delay lock loop (DLL) circuit configured to lock a global clock signal with a first data signal, and output a clock delay control signal when the global clock signal is locked; and
   one or more slave DLL circuits, coupled to receive the clock delay control signal to lock a local clock signal with a local data signal, wherein the local clock signal is based on the global clock signal;
   wherein the master DLL circuit includes a clock DLL and at least one data DLL, and wherein the slave DLL circuit includes at least one data DLL; and
   wherein the clock DLL includes:
   a clock signal input;
   a clock variable delay unit (VDU) having a first input coupled to the clock signal input, and a delayed clock signal output;
   a data VDU having an input coupled to the clock signal input;
   a phase detector having a first input coupled to the delayed clock signal output, and a second input coupled to an output of the data VDU;
   a filter/control circuit having an input coupled to an output of the phase detector, and a first output connected to a second input of the clock VDU;
   a lock circuit having an input coupled to a second output of the filter/control circuit, and a clock delay control signal output.

2. The distributed clock network of claim 1, wherein the master DLL circuit includes:
   a master clock DLL configured to adjust a delay of the global clock signal until a clock signal pulse is locked within an eye opening of the first data signal, and when the clock signal pulse is locked, configured to output the clock delay control signal; and
   a data DLL configured to adjust a delay of the first data signal to substantially center the eye opening of the first data signal on the global clock signal pulse.

3. The distributed clock network of claim 1, wherein the slave DLL is configured to use the clock delay control signal to adjust a delay of a local clock signal to lock a local clock signal pulse within an eye opening of the local data signal, the slave DLL circuit further including:
   a data DLL configured to delay the local data signal to substantially center the eye opening of the local data signal on the local clock signal pulse.

4. The distributed clock network of claim 1, wherein each data DLL includes:
   a clock delay control signal input;
   clock signal input;
   a data signal input;
   a clock variable delay unit (VDU) having a first input coupled to the clock signal input, a second input coupled to the clock delay control signal input, and a delayed clock signal output;
   a data VDU having a first input coupled to the data signal input, and a delayed data signal output;
   a phase detector having a first input coupled to the delayed clock signal output, and a second input coupled to the delayed data signal output;
   a filter/control circuit having an input coupled to an output of the phase detector, and an output connected to a second input of the data VDU; and
   a demultiplexer having a first input coupled to the delayed clock signal output and a second input coupled to the delayed data signal output, and having demultiplexed clock and data outputs.

5. The distributed clock network of claim 1, wherein the clock VDU is configured to receive and delay the global clock signal, wherein the data VDU is configured to receive and delay the global clock signal, wherein the phase detector is configured to measure a phase difference between delayed global clock signals, wherein the filter/control circuit is configured to adjust the delay of the clock VDU to align the clock signal to within the eye opening of the first data signal, and wherein the lock circuit is configured to generate the clock delay control signal when the global clock signal is aligned.

6. The distributed clock network of claim 4, wherein the clock VDU is configured to receive and delay the local clock signal according to the clock delay control signal, wherein the data VDU is configured to receive and delay the local data signal, wherein the phase detector is configured to measure a phase difference between the delayed local clock signal and the delayed local data signal, wherein the filter/control circuit is configured to adjust the delay of the data VDU to align the local data signal with the adjusted delayed local clock signal, and wherein the demultiplexer is configured to output the aligned local data signal and adjusted delayed local clock signal.

7. The distributed clock network of claim 5, wherein the global clock signal includes a pulse, and wherein the global clock signal pulse is aligned within the eye opening of the first data signal.

8. The distributed clock network of claim 6, wherein the local clock signal includes a pulse, and wherein the local clock signal pulse is aligned within the eye opening of the local data signal.

9. A distributed clock network for synchronizing local clock and data signals, comprising:
   a master delay lock loop (DLL) circuit, comprising:
   a clock DLL configured to adjust a delay of a clock signal until a clock signal pulse is locked within an eye opening of each of N parallel data signals, and when the clock signal pulse is locked, configured to output a clock delay control signal; and a data DLL configured to adjust a delay of one of the N parallel data signals to substantially center the eye opening of the data signal on the clock signal pulse; and one or more slave DLL circuits, each receiving the clock delay control signal from the master DLL circuit to adjust a delay of a local clock signal to lock a local clock signal pulse within an eye opening of a local data signal, the slave DLL circuit further comprising:

a data DLL configured to delay a local data signal to substantially center the eye opening of the local data signal on the local clock signal pulse;

wherein the clock DLL includes:

a clock signal input;

a clock variable delay unit (VDU) having a first input coupled to the clock signal input, and a delayed clock signal output;

a data VDU having an input coupled to the clock signal input;

a phase detector having a first input coupled to the delayed clock signal output, and a second input coupled to an output of the data VDU;

a filter/control circuit having an input coupled to an output of the phase detector, and a first output connected to a second input of the clock VDU;

a lock circuit having an input coupled to a second output of the filter/control circuit, and a clock delay control signal output.

10. The distributed clock network of claim 9, wherein each data DLL includes:

a clock delay control signal input;

clock signal input;

a data signal input;

a clock variable delay unit (VDU) having a first input coupled to the clock signal input, a second input coupled to the clock delay control signal input, and a delayed clock signal output;

a data VDU having a first input coupled to the data signal input, and a delayed data signal output;

a phase detector having a first input coupled to the delayed clock signal output, and a second input coupled to the delayed data signal output;

a filter/control circuit having an input coupled to an output of the phase detector, and an output connected to a second input of the data VDU; and a demultiplexer having a first input coupled to the delayed clock signal output and a second input coupled to the delayed data signal output, and having demultiplexed clock and data outputs.

11. The distributed clock network of claim 9, wherein the clock signal pulse is a rising edge of a clock signal waveform.

12. A distributed clock circuit for distributed high speed data, comprising:

a master delay lock loop (DLL) circuit configured to lock a global clock signal with a first data signal, and output a clock delay control signal when the global clock signal is locked; and one or more slave DLL circuits, coupled to receive the clock delay control signal to lock a local clock signal with a local data signal, wherein the local clock signal is based on the global clock signal;

wherein the master DLL circuit and the slave DLL circuit each includes at least one data DLL; and wherein each data DLL includes:

a clock delay control signal input;

clock signal input;

a data signal input;

a clock variable delay unit (VDU) having a first input coupled to the clock signal input, a second input coupled to the clock delay control signal input, and a delayed clock signal output;

a data VDU having a first input coupled to the data signal input, and a delayed data signal output;

a phase detector having a first input coupled to the delayed clock signal output, and a second input coupled to the delayed data signal output;

a filter/control circuit having an input coupled to an output of the phase detector, and an output connected to a second input of the data VDU; and a demultiplexer having a first input coupled to the delayed clock signal output and a second input coupled to the delayed data signal output, and having demultiplexed clock and data outputs.

13. The distributed clock network of claim 12, wherein the clock VDU is configured to receive and delay the local clock signal according to the clock delay control signal, wherein the data VDU is configured to receive and delay the local data signal, wherein the phase detector is configured to measure a phase difference between the delayed local clock signal and the delayed local data signal, wherein the filter/control circuit is configured to adjust the delay of the data VDU to align the local data signal with the adjusted delayed local clock signal, and wherein the demultiplexer is configured to output the aligned local data signal and adjusted delayed local clock signal.

* * * * *